US012690489B2

(12) United States Patent
 Iguchi

(10) Patent No.: US 12,690,489 B2
(45) Date of Patent: Jul. 21, 2026

(54) SEMICONDUCTOR DEVICE AND METHOD FOR PRODUCING SEMICONDUCTOR DEVICE

(71) Applicants:KABUSHIKI KAISHA TOSHIBA, Tokyo (JP); TOSHIBA ELECTRONIC DEVICES & STORAGE CORPORATION, Tokyo (JP)

(72) Inventor: Tomohiro Iguchi, Himeji Hyogo (JP)

(73) Assignees: Kabushiki Kaisha Toshiba, Kawasaki (JP); Toshiba Electronic Devices & Storage Corporation, Kawasaki (JP)

( * ) Notice: Subject to any disclaimer, the term of this patent is extended or adjusted under 35 U.S.C. 154(b) by 551 days.

(21) Appl. No.: 17/890,554

(22) Filed: Aug. 18, 2022

(65) Prior Publication Data

US 2023/0299038 A1      Sep. 21, 2023

(30) Foreign Application Priority Data

Mar. 15, 2022    (JP) ................................. 2022-039795

(51) Int. Cl.
 *H10W 90/00*          (2026.01)
 *H10W 40/25*          (2026.01)
           (Continued)
(52) U.S. Cl.
 CPC ......... *H10W 90/00* (2026.01); *H10W 40/255* (2026.01); *H10W 76/01* (2026.01);
           (Continued)
(58) Field of Classification Search
 CPC ........................................... H01L 2924/13055
 See application file for complete search history.

(56) References Cited

U.S. PATENT DOCUMENTS

| | | |
|---|---|---|
| 9,917,065 B1 | 3/2018 | Ward et al. |
| 2005/0167473 A1 | 8/2005 | Mayer et al. |
| (Continued) | | |

FOREIGN PATENT DOCUMENTS

| | | |
|---|---|---|
| EP | 2590309 A1 | 5/2013 |
| EP | 2677541 A1 | 12/2013 |
| (Continued) | | |

OTHER PUBLICATIONS

Notice of Reasons for Refusal (Office Action) dated Feb. 18, 2025 in corresponding Japanese Patent Application No. 2022-039795 with English machine translation (9 pages).
(Continued)

*Primary Examiner* — Yu-Hsi D Sun
(74) *Attorney, Agent, or Firm* — Kim & Stewart LLP

(57) ABSTRACT

A semiconductor device according to the embodiment includes: a frame body having a wall surface; an insulating substrate surrounded by the frame body, the insulating substrate having a first metal layer and a second metal layer on a surface, the second metal layer being located between the first metal layer and the wall surface; a semiconductor chip including an electrode and provided on the first metal layer; and a bonding wire having a first bond portion connected to the electrode, a second bond portion connected to the second metal layer, and an intermediate portion between the first bond portion and the second bond portion; wherein a second angle formed between a second direction in which the second bond portion extends and the wall surface is smaller than a first angle formed between a first direction in which the intermediate portion extends and the wall surface.

18 Claims, 17 Drawing Sheets

(51) Int. Cl.

| | |
|---|---|
| *H10W 76/01* | (2026.01) |
| *H10W 76/134* | (2026.01) |
| *H10W 72/00* | (2026.01) |
| *H10W 72/50* | (2026.01) |
| *H10W 76/12* | (2026.01) |

(52) U.S. Cl.

CPC .... *H10W 76/134* (2026.01); *H10W 72/07533* (2026.01); *H10W 72/5363* (2026.01); *H10W 72/884* (2026.01); *H10W 76/12* (2026.01); *H10W 90/734* (2026.01); *H10W 90/754* (2026.01)

(56) References Cited

U.S. PATENT DOCUMENTS

| | | | |
|---|---|---|---|
| 2014/0138426 A1 | 5/2014 | Hagiwara | |
| 2014/0231926 A1 | 8/2014 | Okumura | |
| 2015/0108664 A1 | 4/2015 | Okumura | |
| 2016/0351537 A1 | 12/2016 | Sekine | |
| 2021/0082898 A1 | 3/2021 | Azha | |
| 2021/0098344 A1* | 4/2021 | Murata | H01L 23/3135 |
| 2021/0305147 A1 | 9/2021 | Iguchi et al. | |

| | | | |
|---|---|---|---|
| 2022/0149001 A1 | 5/2022 | Sekine et al. |
| 2023/0163056 A1 | 5/2023 | Nakazawa |

FOREIGN PATENT DOCUMENTS

| | | | |
|---|---|---|---|
| EP | 3886154 A1 | 9/2021 |
| JP | H05-021883 Y2 | 6/1993 |
| JP | 2003-158147 A | 5/2003 |
| JP | 2003218154 A | 7/2003 |
| JP | 2008166622 A | 7/2008 |
| JP | 2012256861 A | 12/2012 |
| JP | 2013098425 A | 5/2013 |
| JP | 2017045747 A | 3/2017 |
| JP | 2021044452 A | 3/2021 |
| JP | 7409526 B2 | 1/2024 |
| WO | 2013046824 A1 | 3/2015 |
| WO | 2015122410 A1 | 8/2015 |
| WO | 2020/184338 A1 | 9/2020 |

OTHER PUBLICATIONS

Decision to Grant a Patent mailed Jun. 24, 2025 in corresponding Japanese Patent Application No. 2022-039795, with English machine translation, 6 pages.

* cited by examiner

10a

10

32          30          31

SEMICONDUCTOR DEVICE AND METHOD FOR PRODUCING SEMICONDUCTOR DEVICE

CROSS-REFERENCE TO RELATED APPLICATION

This application is based upon and claims the benefit of priority from Japanese Patent Application No. 2022-039795, filed on Mar. 15, 2022, the entire contents of which are incorporated herein by reference.

FIELD

Embodiments described herein relate generally to a semiconductor device and a method for producing the semiconductor device.

BACKGROUND

In a power semiconductor module, for example, a power semiconductor chip is mounted on a metal base with an insulating substrate interposed between the power semiconductor chip and the metal base. The power semiconductor chip is, for example, a metal oxide semiconductor field effect transistor (MOSFET), an insulated gate bipolar transistor (IGBT), or a diode.

In order to realize miniaturization of a device on which the power semiconductor module is to be mounted, miniaturization of the power semiconductor module is desired.

DETAILED DESCRIPTION

Figure 1:
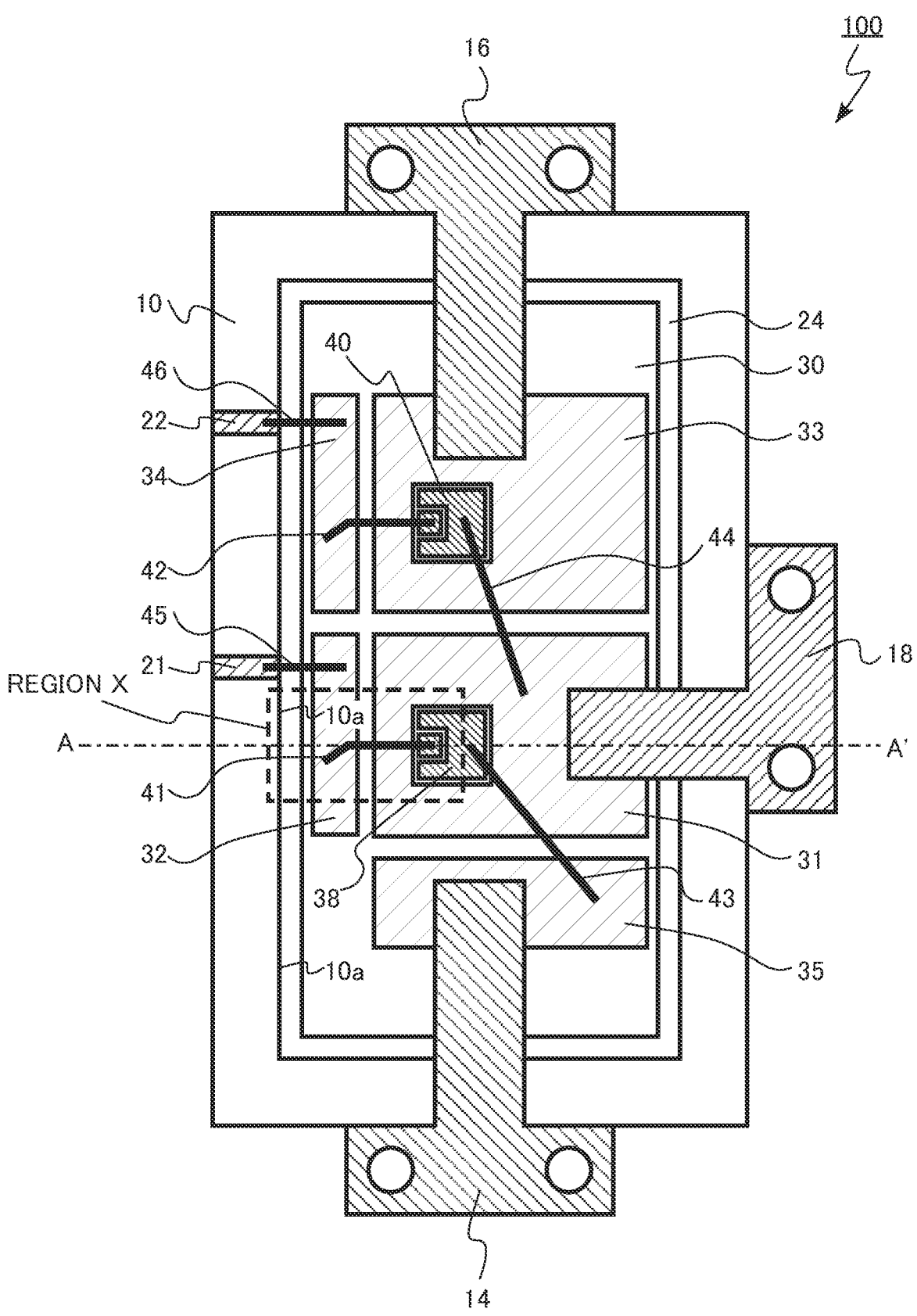
FIG. 1 is a schematic top view of a semiconductor device according to an embodiment.

A semiconductor device according to an aspect of the present disclosure includes: a frame body having a wall surface; an insulating substrate surrounded by the frame body, the insulating substrate having a first metal layer and a second metal layer on a surface, the second metal layer being located between the first metal layer and the wall surface; a semiconductor chip including an electrode and provided on the first metal layer; and a bonding wire having a first bond portion connected to the electrode, a second bond portion connected to the second metal layer, and an intermediate portion between the first bond portion and the second bond portion; wherein a second angle formed between a second direction in which the second bond portion extends and the wall surface is smaller than a first angle formed between a first direction in which the intermediate portion extends and the wall surface.

In the present specification, the same or similar members are denoted by the same reference numerals, and redundant description may be omitted.

In the present specification, in order to indicate a positional relationship of components and the like, an upward direction in the drawings may be described as "upper", and a downward direction in the drawings may be described as "lower". In the present specification, the concepts of "upper" and "lower" are not necessarily terms indicating the relationship with the direction of gravity.

A semiconductor device according to the embodiment includes: a frame body having a wall surface; an insulating substrate surrounded by the frame body, the insulating substrate having a first metal layer and a second metal layer on a surface, the second metal layer being located between the first metal layer and the wall surface; a semiconductor chip including an electrode and provided on the first metal layer; and a bonding wire having a first bond portion connected to the electrode, a second bond portion connected to the second metal layer, and an intermediate portion between the first bond portion and the second bond portion. A second angle formed between a second direction in which the second bond portion extends and the wall surface is smaller than a first angle formed between a first direction in which the intermediate portion extends and the wall surface.

Figure 2:
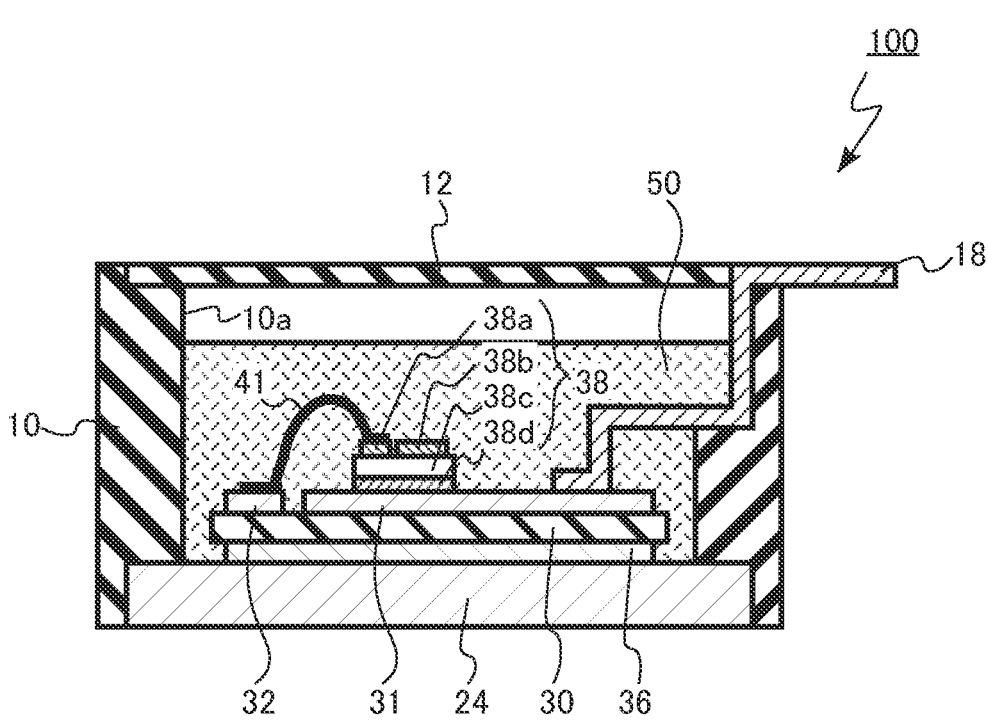
FIG. 2 is a schematic cross-sectional view of the semiconductor device according to the embodiment.

FIG. 1 is a schematic top view of the semiconductor device according to the embodiment. FIG. 2 is a schematic cross-sectional view of the semiconductor device according to the embodiment. FIG. 2 is a cross section taken along line AA' in FIG. 1.

The semiconductor device of the embodiment is a power semiconductor module 100. As illustrated in FIG. 1, in the power semiconductor module 100 of the embodiment, two MOSFETs are connected in series. The power semiconductor module of the embodiment is a so-called "two-in-one" module in which a half bridge circuit can be configured by one module. For example, a three-phase inverter circuit can be configured by using three power semiconductor modules of the embodiment.

The power semiconductor module 100 of the embodiment includes a resin case 10 (frame body), a lid 12, a first main terminal 14, a second main terminal 16, an AC output terminal 18, a first gate terminal 21, a second gate terminal 22, a metal base 24, an insulating substrate 30, a first metal layer 31, a second metal layer 32, a third metal layer 33, a fourth metal layer 34, a fifth metal layer 35, a backside metal layer 36, a first MOSFET 38 (semiconductor chip), a second MOSFET 40, a first bonding wire 41 (bonding wire), a second bonding wire 42, a third bonding wire 43, a fourth bonding wire 44, a fifth bonding wire 45, a sixth bonding wire 46, and a sealing resin 50.

The resin case 10 has a wall surface 10a. The first MOSFET 38 includes a gate electrode pad 38a (electrode), a source electrode 38b, a semiconductor layer 38c, and a drain electrode 38d. The first bonding wire 41 includes a first bond portion 41a, a second bond portion 41b, and a loop portion 41c. The loop portion 41c is an example of an intermediate portion.

FIG. 1 is a top view of the power semiconductor module 100 from which the lid 12 and the sealing resin 50 are removed.

The metal base 24 is made of, for example, copper. For example, when the power semiconductor module 100 is mounted on a product, a heat sink (not illustrated) is connected to the back surface of the metal base 24.

The insulating substrate 30 is provided above the metal base 24. The insulating substrate 30 is surrounded by the resin case 10. The insulating substrate 30 is provided between the metal base 24 and the first MOSFET 38 and between the metal base 24 and the second MOSFET 40. The insulating substrate 30 has a function of electrically separating the metal base 24 from the first MOSFET 38 and the second MOSFET 40.

The insulating substrate 30 is made of, for example, ceramic. The insulating substrate 30 is made of, for example, aluminum oxide, aluminum nitride, or silicon nitride.

The first metal layer 31, the second metal layer 32, the third metal layer 33, the fourth metal layer 34, and the fifth metal layer 35 are provided on the surface of the insulating substrate 30. The first metal layer 31, the second metal layer 32, the third metal layer 33, the fourth metal layer 34, and the fifth metal layer 35 are made of, for example, copper.

The second metal layer 32 is located between the first metal layer 31 and the wall surface 10a of the resin case 10. The fourth metal layer 34 is located between the third metal layer 33 and the wall surface 10a of the resin case 10.

The backside metal layer 36 is provided on the back surface of the insulating substrate 30. The backside metal layer 36 is made of, for example, copper. The backside metal layer 36 is bonded to the metal base 24 by using, for example, a solder layer or a metal nanoparticle layer (not illustrated).

The resin case 10 is provided around the metal base 24 and the insulating substrate 30. A part of the resin case 10 is provided on the metal base 24. The resin case is an example of a frame body. The resin case 10 has a function of protecting the first MOSFET 38, the second MOSFET 40, and the insulating substrate 30. The resin case has a wall surface 10a.

The lid 12 is provided on the resin case 10. The first MOSFET 38 and the second MOSFET 40 are disposed between the lid 12 and the insulating substrate 30. The lid 12 has a function of protecting the first MOSFET 38, the second MOSFET 40, and the insulating substrate 30.

The first bonding wire 41, the second bonding wire 42, the third bonding wire 43, the fourth bonding wire 44, the fifth bonding wire 45, and the sixth bonding wire 46 electrically connect the members of the power semiconductor module 100. Materials of the first bonding wire 41, the second bonding wire 42, the third bonding wire 43, the fourth bonding wire 44, the fifth bonding wire 45, and the sixth bonding wire 46 are, for example, aluminum, copper, or gold.

The first MOSFET 38 is provided above the insulating substrate 30. The first MOSFET 38 has the gate electrode pad 38a, the source electrode 38b, the semiconductor layer 38c, and the drain electrode 38d. The gate electrode pad 38a is an example of an electrode.

The first MOSFET 38 is formed using, for example, silicon carbide. The semiconductor layer 38c is, for example, a silicon carbide layer.

The first MOSFET 38 is provided on the first metal layer 31. The drain electrode 38d is fixed on the first metal layer 31 by using, for example, a solder layer or a metal nanoparticle layer (not illustrated). The drain electrode 38d is bonded to the first metal layer 31. The drain electrode 38d is electrically connected to the first metal layer 31.

The source electrode 38b is electrically connected to the fifth metal layer 35. The source electrode 38b is electrically connected to the fifth metal layer 35 by the third bonding wire 43.

The gate electrode pad 38a is electrically connected to the second metal layer 32. The gate electrode pad 38a is electrically connected to the second metal layer 32 by the first bonding wire 41.

The second MOSFET 40 is provided above the insulating substrate 30. The second MOSFET 40 is provided on the third metal layer 33.

The sealing resin 50 is filled in the resin case 10. The sealing resin 50 is surrounded by the resin case 10. The sealing resin 50 covers the first MOSFET 38, the second MOSFET 40, and the insulating substrate 30.

The sealing resin 50 has a function of protecting the first MOSFET 38, the second MOSFET 40, and the insulating substrate 30. In addition, the sealing resin 50 has a function of insulating the first MOSFET 38, the second MOSFET 40, and the insulating substrate 30.

The sealing resin 50 contains a resin. The sealing resin 50 is, for example, a silicone gel. For example, other resins such as an epoxy resin and a polyimide resin can be applied to the sealing resin 50.

The first main terminal 14 is electrically connected to the fifth metal layer 35. For example, a negative voltage is applied to the first main terminal 14 from the outside. The first main terminal 14 is made of, for example, copper.

The second main terminal 16 is electrically connected to the third metal layer 33. For example, a positive voltage is applied to the second main terminal 16 from the outside. The second main terminal 16 is made of, for example, copper.

The AC output terminal 18 is electrically connected to the first metal layer 31. One end of the AC output terminal 18 is fixed to the first metal layer 31, for example. The AC output terminal 18 outputs an output current of the half bridge circuit.

The first gate terminal 21 is electrically connected to the gate electrode pad 38a of the first MOSFET 38. The first gate terminal 21 has a function of applying a gate voltage signal for controlling the first MOSFET 38 to the gate electrode pad 38a.

The second gate terminal 22 is electrically connected to the gate electrode pad of the second MOSFET 40. The second gate terminal 22 has a function of applying a gate voltage signal for controlling the second MOSFET 40 to the gate electrode pad.

Figure 3:
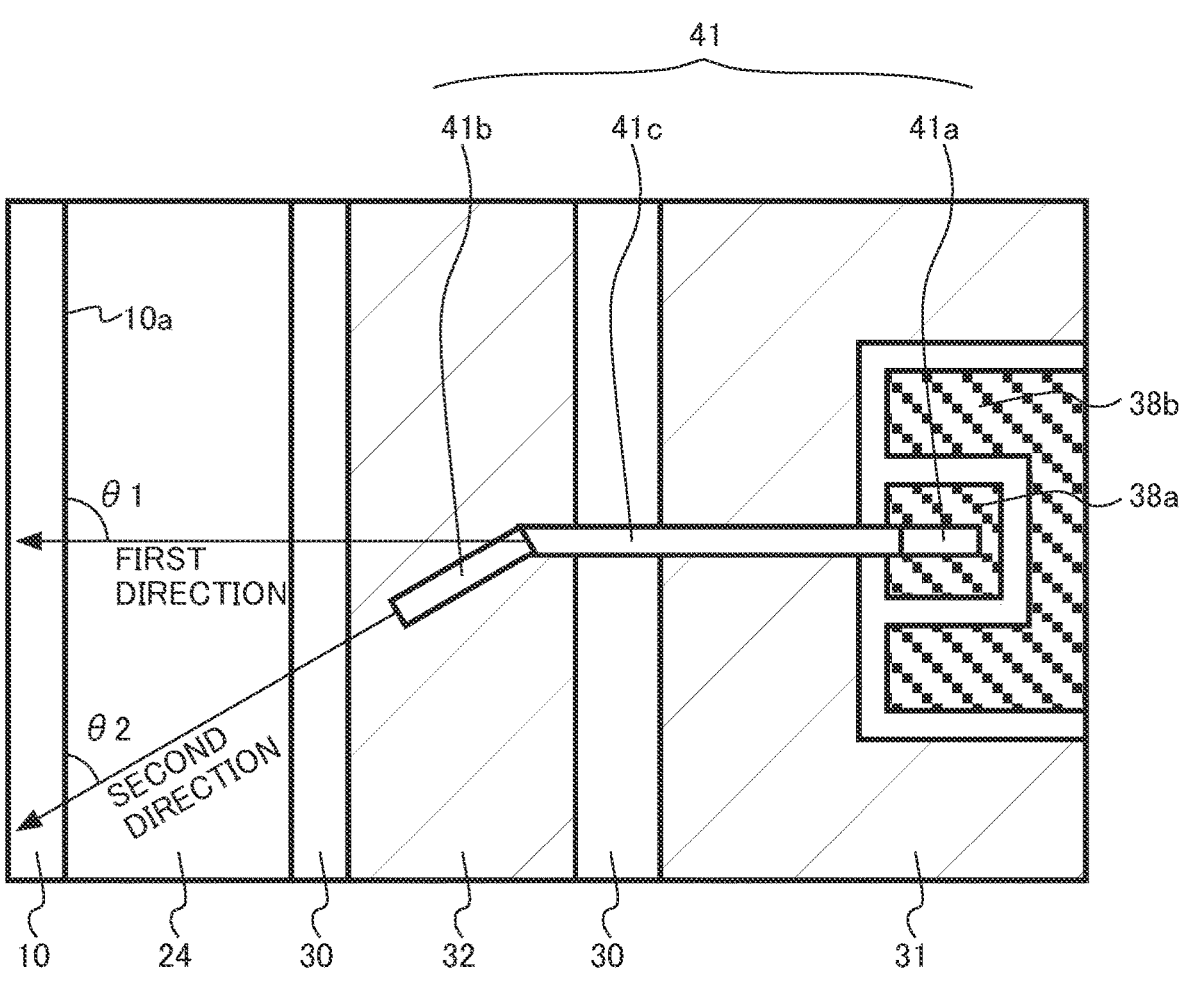
FIG. 3 is an enlarged schematic top view of the semiconductor device according to the embodiment.

FIG. 3 is an enlarged schematic top view of the semiconductor device according to the embodiment. FIG. 3 is an enlarged view of a region X surrounded by a broken line in FIG. 1. FIG. 3 is a top view of a state in which the lid 12 and the sealing resin 50 are removed.

Figure 4:
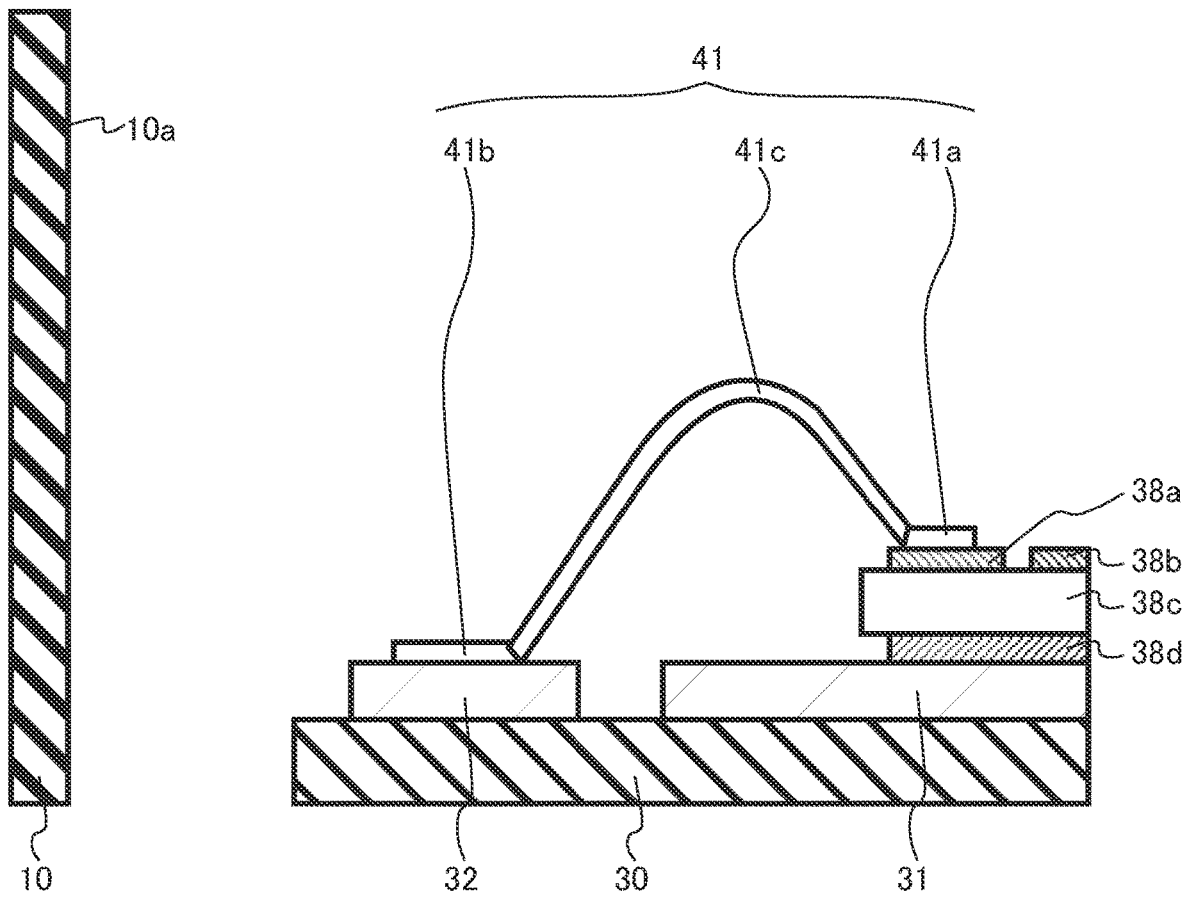
FIG. 4 is an enlarged schematic cross-sectional view of the semiconductor device according to the embodiment.

FIG. 4 is an enlarged schematic cross-sectional view of the semiconductor device according to the embodiment. FIG. 4 is a cross-sectional view including a region along the bonding wire of FIG. 3.

The first bonding wire 41 has the first bond portion 41a, the second bond portion 41b, and the loop portion 41c.

The first bond portion 41a is connected to the gate electrode pad 38a of the first MOSFET 38. The second bond portion 41b is connected to the second metal layer 32. The loop portion 41c is located between the first bond portion 41a and the second bond portion 41b.

When the first bonding wire 41 is formed, the first bond portion 41a is formed before the second bond portion 41b.

The loop portion 41c extends in the first direction. An angle formed between the first direction and the wall surface 10a of the resin case 10 is a first angle ($\theta1$ in FIG. 3). The first angle $\theta1$ is, for example, 60 degrees or more and 90 degrees or less.

The second bond portion 41b extends in the second direction. The second direction is different from the first direction. An angle formed between the second direction and the wall surface 10a of the resin case 10 is a second angle ($\theta2$ in FIG. 3). The second angle is, for example, 0 degrees or more and 80 degrees or less.

The second angle $\theta2$ is smaller than the first angle $\theta1$. The difference between the first angle $\theta1$ and the second angle $\theta2$ is, for example, 10 degrees or more and 90 degrees or less. The difference between the first angle $\theta1$ and the second angle $\theta2$ is preferably, for example, 20 degrees or more and 45 degrees or less.

Next, an example of the method for producing the semiconductor device according to the embodiment will be described. Hereinafter, in particular, the formation of the bonding wire will be described.

A method for producing a semiconductor device according to the embodiment includes: preparing an insulating substrate surrounded by a frame body having a wall surface, the insulating substrate having a first metal layer and a second metal layer on a surface, the second metal layer being located between the first metal layer and the wall surface; disposing a semiconductor chip including an electrode on the first metal layer; forming a first bond portion of a bonding wire on the electrode; forming an intermediate portion of the bonding wire, the intermediate portion extending in a first direction; and forming a second bond portion of the bonding wire on the second metal layer, the second bond portion extending in a second direction; wherein a second angle formed between the second direction and the wall surface is smaller than a first angle formed between the first direction and the wall surface.

Figure 5:
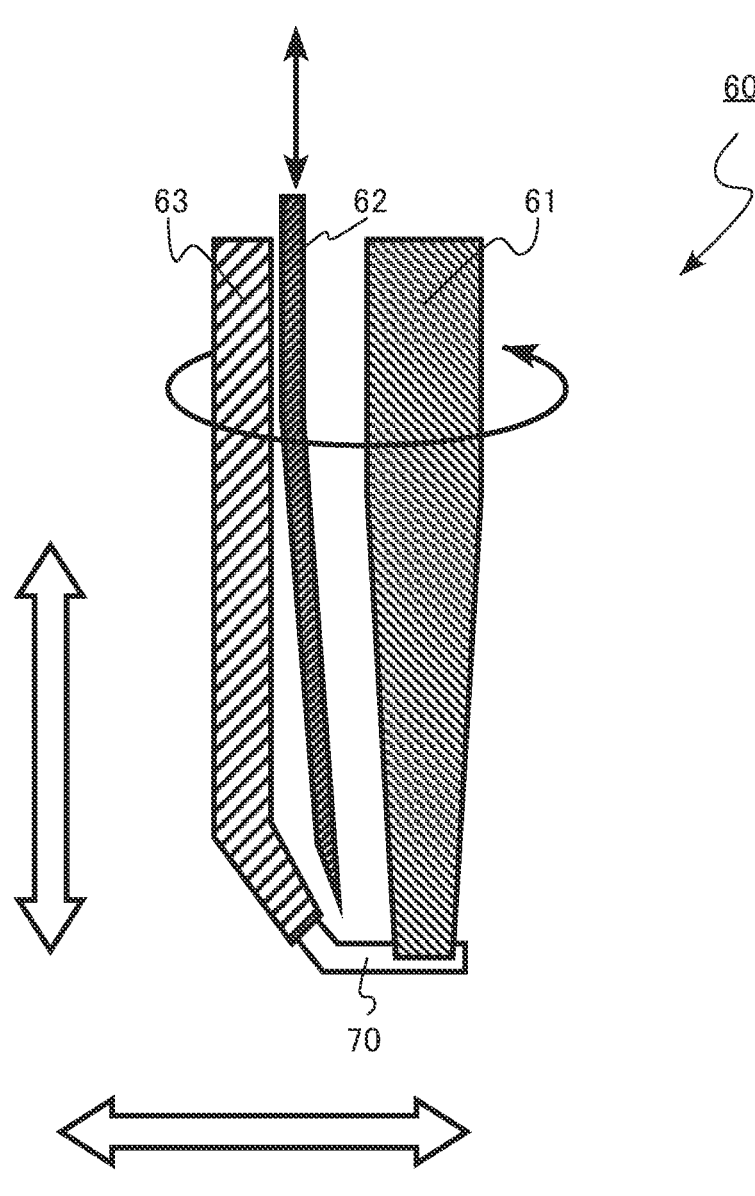
FIG. 5 is a schematic view of a wedge bonding apparatus used in a method for producing the semiconductor device according to the embodiment.

FIG. 5 is a schematic view of a wedge bonding apparatus used in the method for producing the semiconductor device according to the embodiment. FIG. 5 is an enlarged view of a tip portion of a bonding head of the wedge bonding apparatus.

A bonding head 60 of the wedge bonding apparatus of the embodiment includes a wedge tool 61, a cutter blade 62, and a wire guide 63.

The bonding head 60 can move up, down, left, and right. Further, the bonding head 60 can rotate in a horizontal plane.

The wedge tool 61 has a groove (not illustrated) for holding a wire 70 at the distal end. The wire 70 and a portion to be connected are bonded by applying ultrasonic vibration in a state in which the wire 70 is pressed against the portion to be connected by the wedge tool 61.

The cutter blade 62 has a function of cutting the wire 70. The cutter blade 62 can move in the vertical direction independently with respect to the wedge tool 61 and the wire guide 63.

The wire guide 63 has a function of feeding the wire 70 to the wedge tool 61.

FIGS. 6, 7, 8, 9, 10, 11, 12, 13, 14, and 15 are schematic views illustrating the method for producing the semiconductor device according to the embodiment. FIGS. 6 to 15 are views corresponding to the cross section illustrated in FIG. 4. FIGS. 6 to 15 are views illustrating a method for forming the first bonding wire 41 illustrated in FIG. 4.

Figure 6:
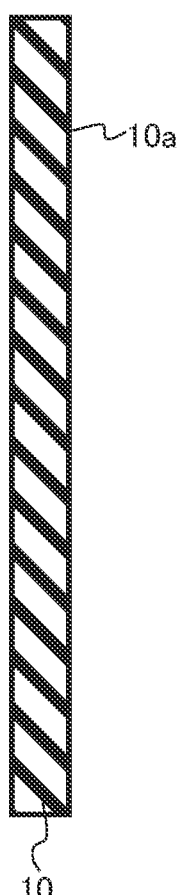
FIG. 6 is a schematic view illustrating the method for producing the semiconductor device according to the embodiment.
Figure 6:
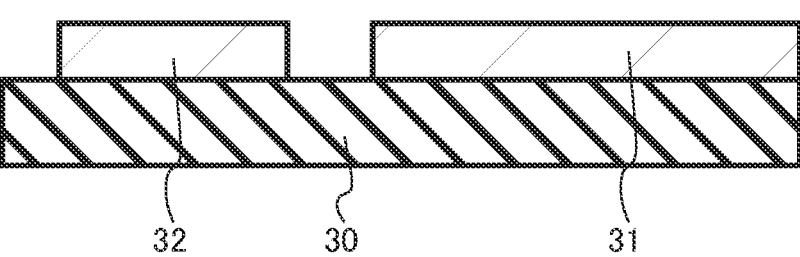

First, the insulating substrate 30 surrounded by the resin case 10 having the wall surface 10a is prepared (FIG. 6). The resin case 10 is an example of a frame body.

The first metal layer 31 and the second metal layer 32 are provided on the surface of the insulating substrate 30. The second metal layer 32 is located between the first metal layer 31 and the wall surface 10a.

Figure 7:
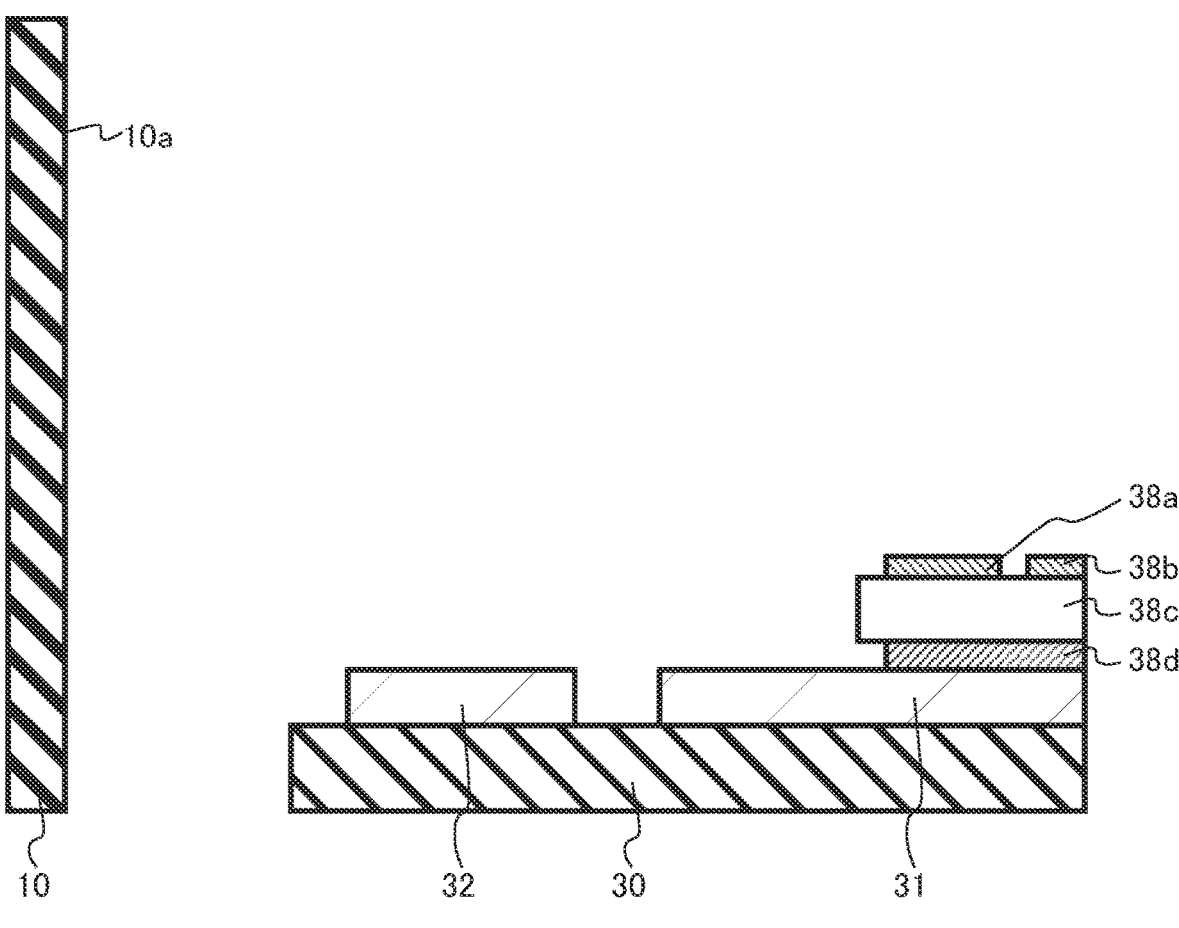
FIG. 7 is a schematic view illustrating the method for producing the semiconductor device according to the embodiment.

Next, the first MOSFET 38 is disposed on the first metal layer 31 (FIG. 7). The first MOSFET 38 is an example of a semiconductor chip.

The first MOSFET 38 is bonded to the first metal layer 31. The first MOSFET 38 includes the gate electrode pad 38a, the source electrode 38b, the semiconductor layer 38c, and the drain electrode 38d. The gate electrode pad 38a is an example of an electrode.

Next, the first bonding wire 41 is formed using the wedge bonding apparatus.

Figure 8:
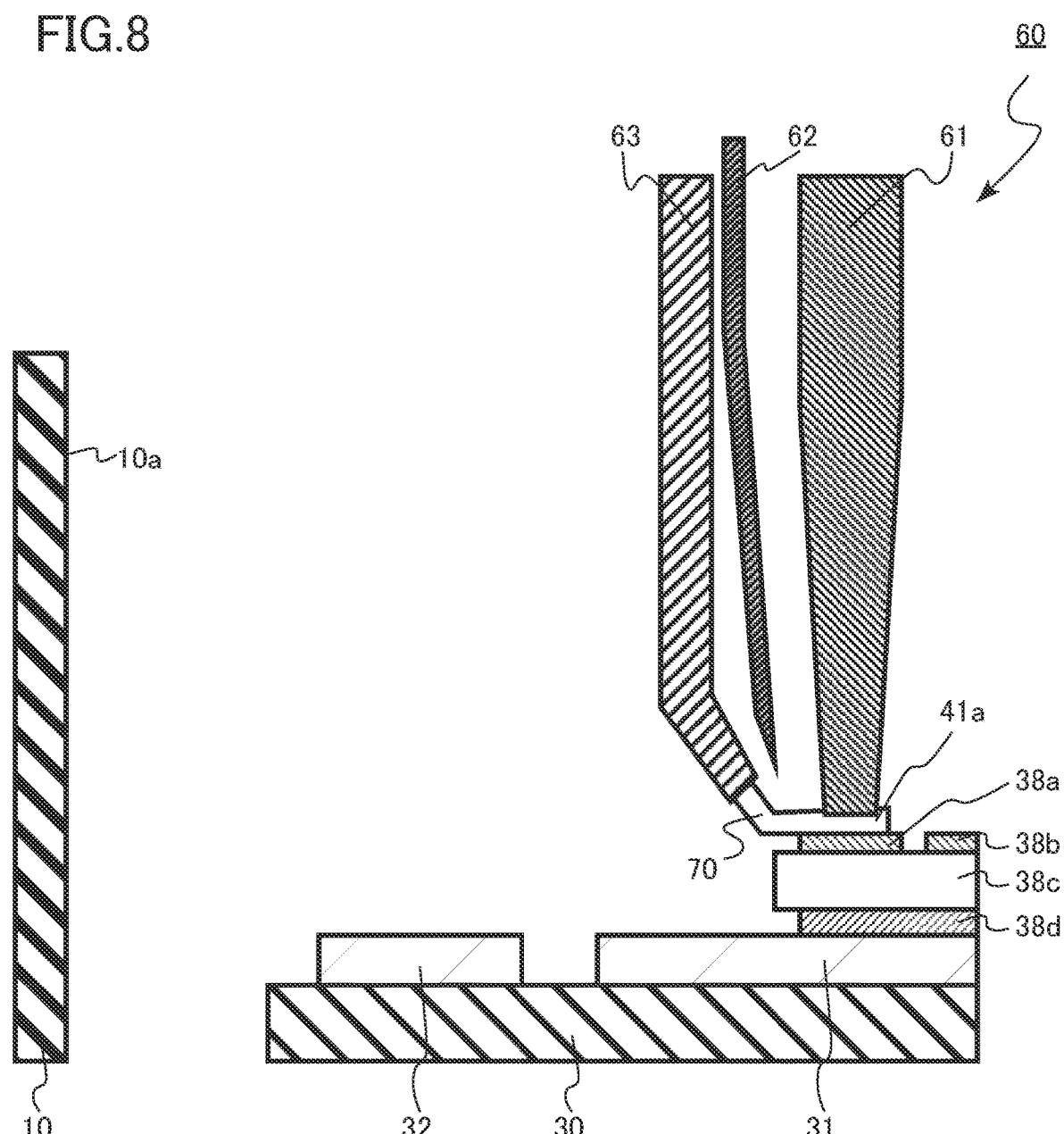
FIG. 8 is a schematic view illustrating the method for producing the semiconductor device according to the embodiment.

First, the wire 70 is pressed against the surface of the gate electrode pad 38a by the wedge tool 61 to form the first bond portion 41a (FIG. 8).

Figure 9:
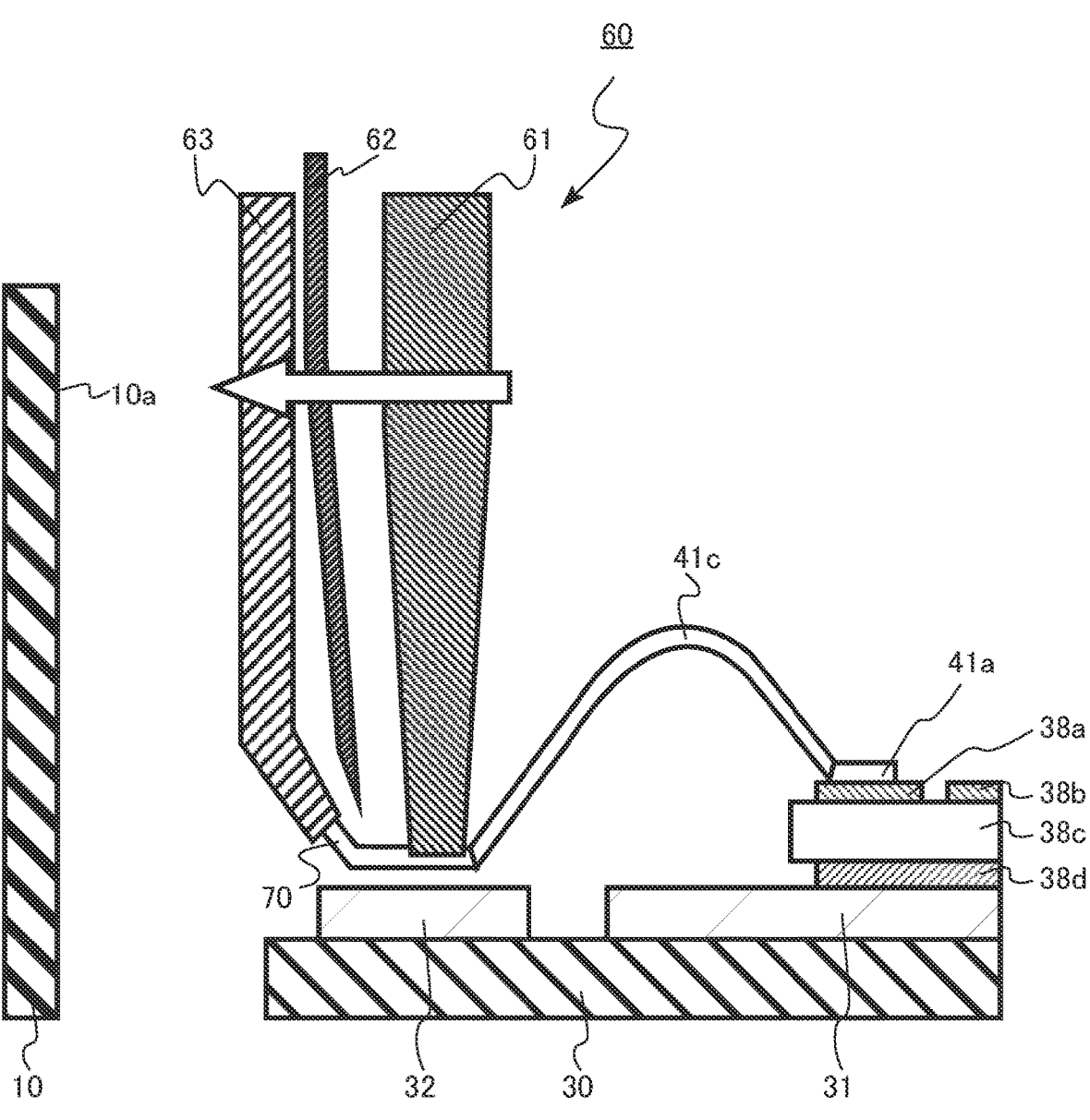
FIG. 9 is a schematic view illustrating the method for producing the semiconductor device according to the embodiment.

Next, the bonding head 60 is moved in the lateral direction to form the loop portion 41c (FIG. 9). The loop portion 41c is an example of an intermediate portion. The bonding head 60 moves in the first direction illustrated in FIG. 3. The loop portion 41c extends in the first direction illustrated in FIG. 3.

Figure 10:
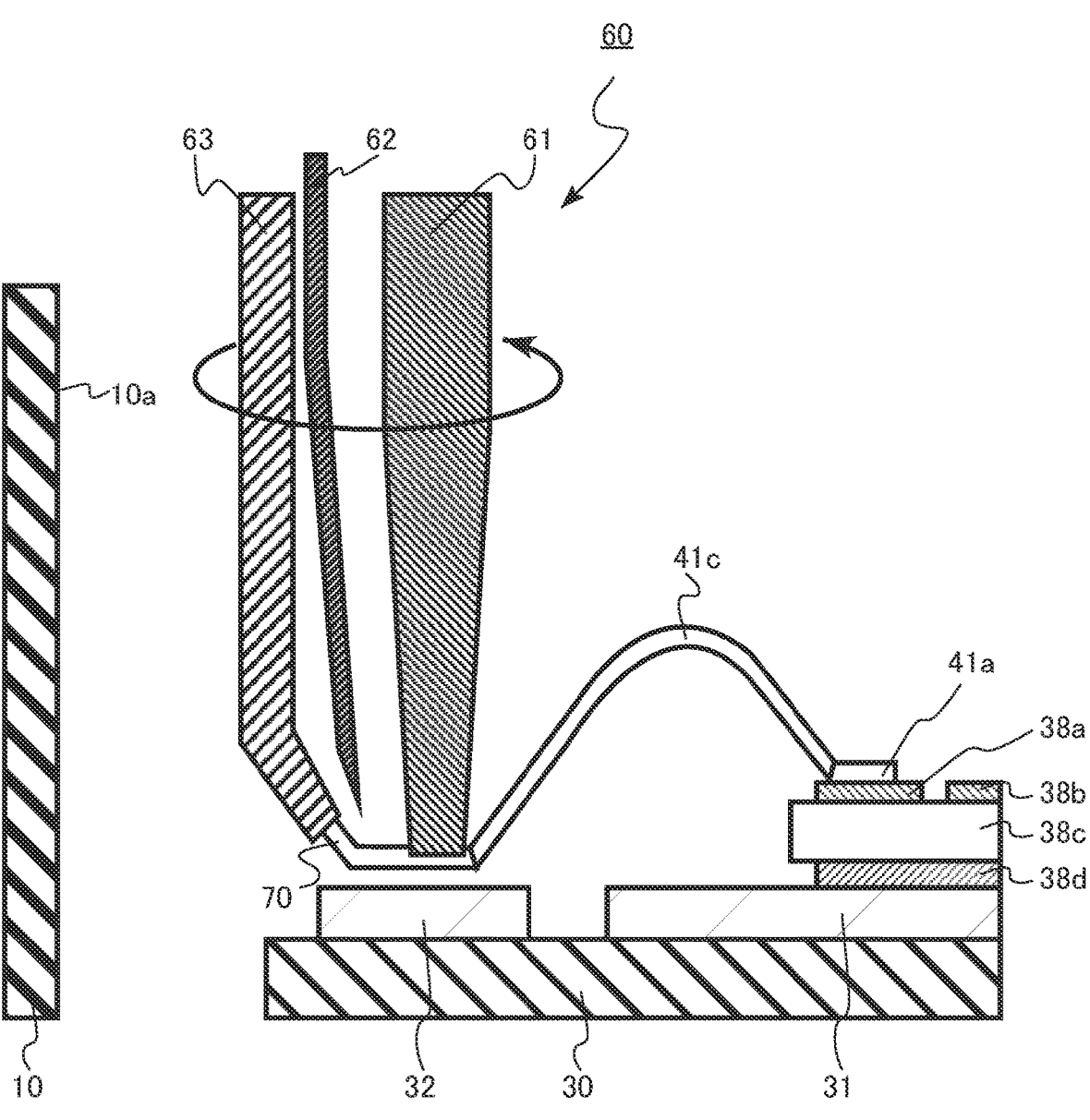
FIG. 10 is a schematic view illustrating the method for producing the semiconductor device according to the embodiment.

Next, when the bonding head 60 reaches a predetermined region where the second bond portion 41b is to be formed, the bonding head 60 is rotated in a plane horizontal to the surface of the second metal layer 32 (FIG. 10). The rotation angle is, for example, 10 degrees or more and 90 degrees or less. The rotation angle is preferably, for example, 20 degrees or more and 45 degrees or less.

Figure 11:
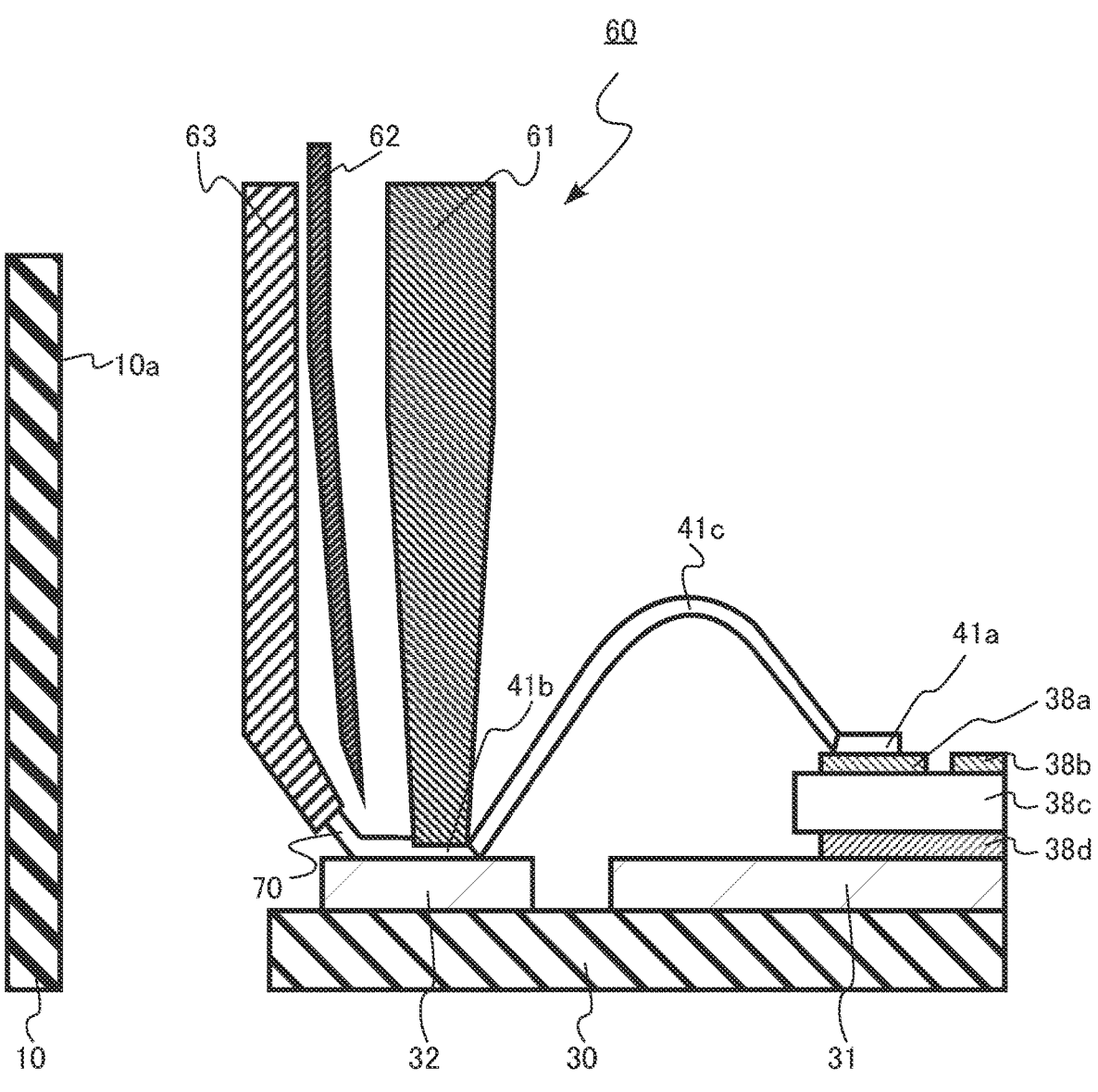
FIG. 11 is a schematic view illustrating the method for producing the semiconductor device according to the embodiment.

Next, the wire 70 is pressed against the surface of the second metal layer 32 by the wedge tool 61 to form the second bond portion 41b (FIG. 11). As the bonding head 60 rotates, the second bond portion 41b extends in the second direction illustrated in FIG. 3.

Figure 12:
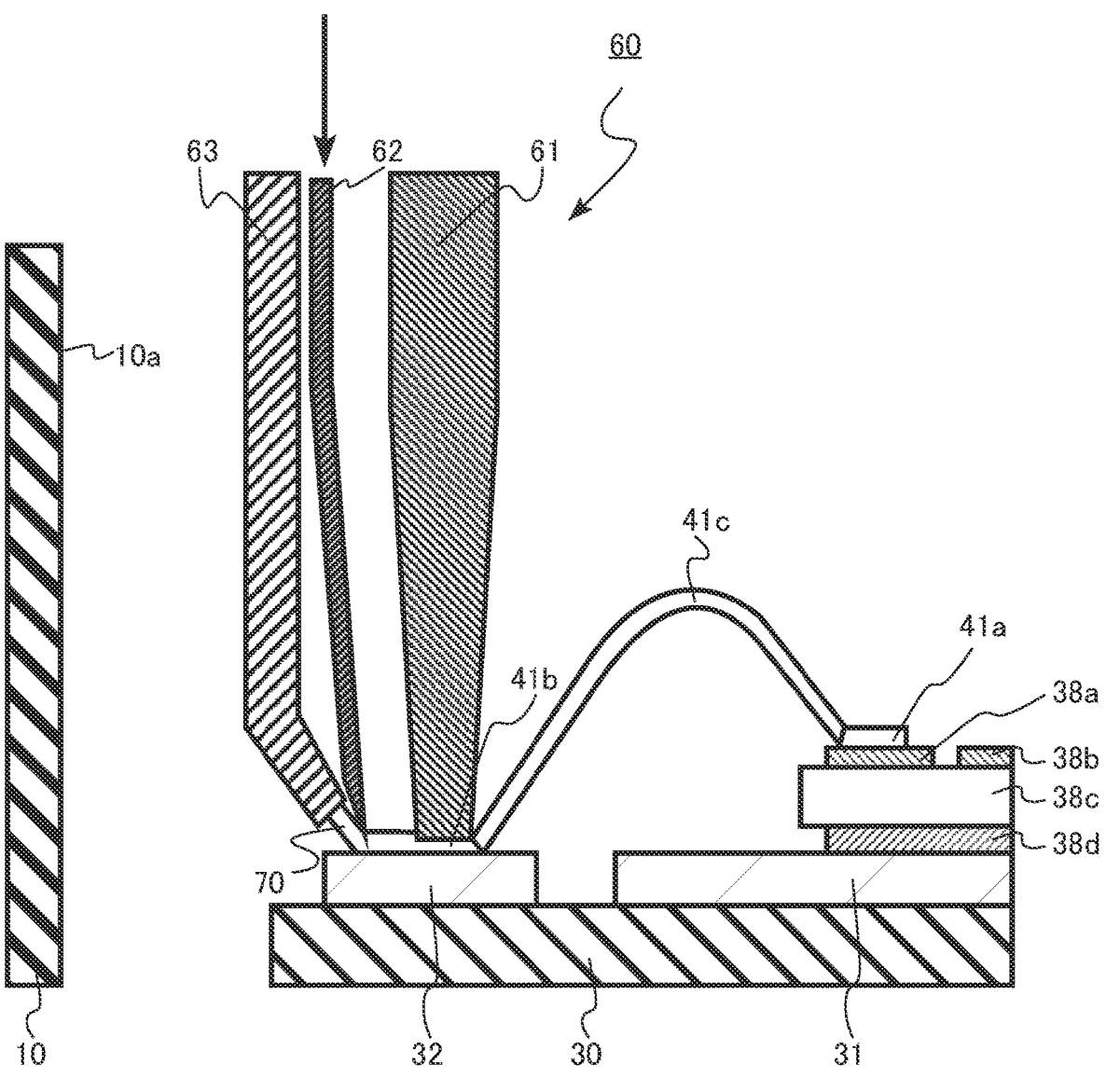
FIG. 12 is a schematic view illustrating the method for producing the semiconductor device according to the embodiment.

Next, the wire 70 is half-cut by the cutter blade 62 (FIG. 12).

Figure 13:
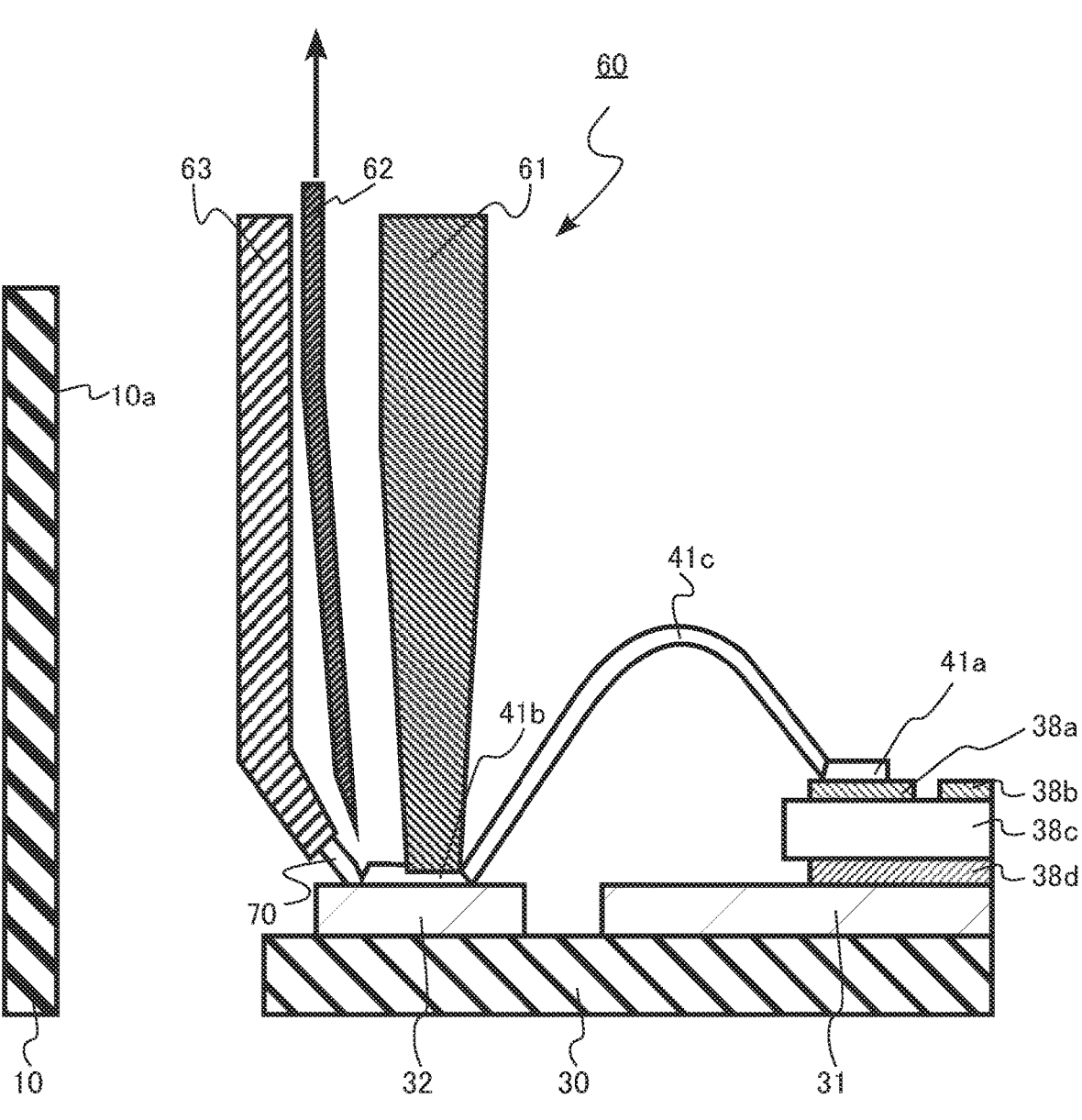
FIG. 13 is a schematic view illustrating the method for producing the semiconductor device according to the embodiment.

Next, the cutter blade 62 is separated from the wire 70 (FIG. 13).

Figure 14:
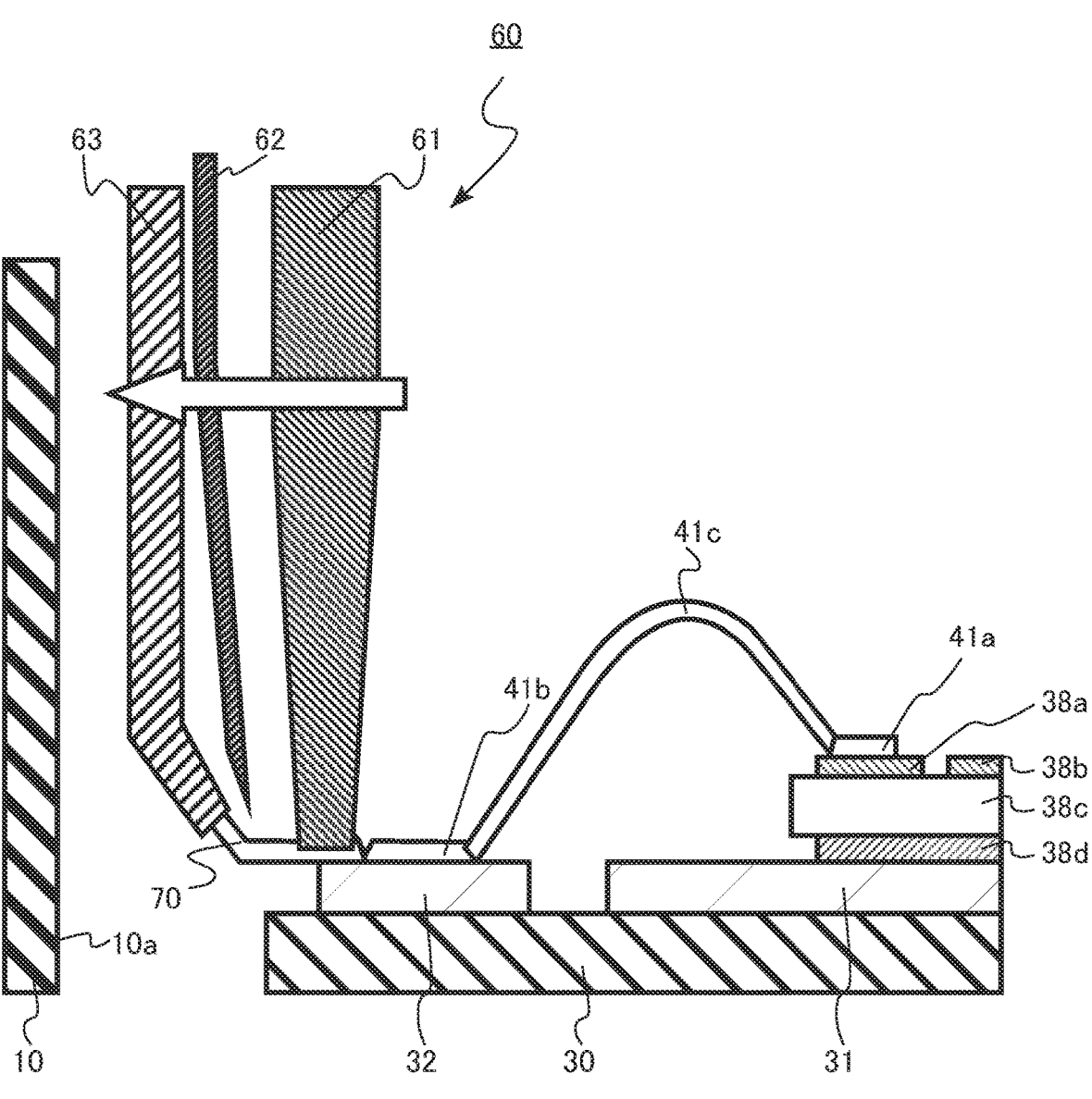
FIG. 14 is a schematic view illustrating the method for producing the semiconductor device according to the embodiment.

Next, the bonding head 60 is moved in the lateral direction while the wire 70 is fed out from the wire guide 63 (FIG. 14). The bonding head 60 is moved toward the wall surface 10*a*. The bonding head 60 is moved in the second direction illustrated in FIG. 3. The wire 70 fed from the wire guide 63 serves as the first bond portion when the next wire bonding is formed.

Figure 15:
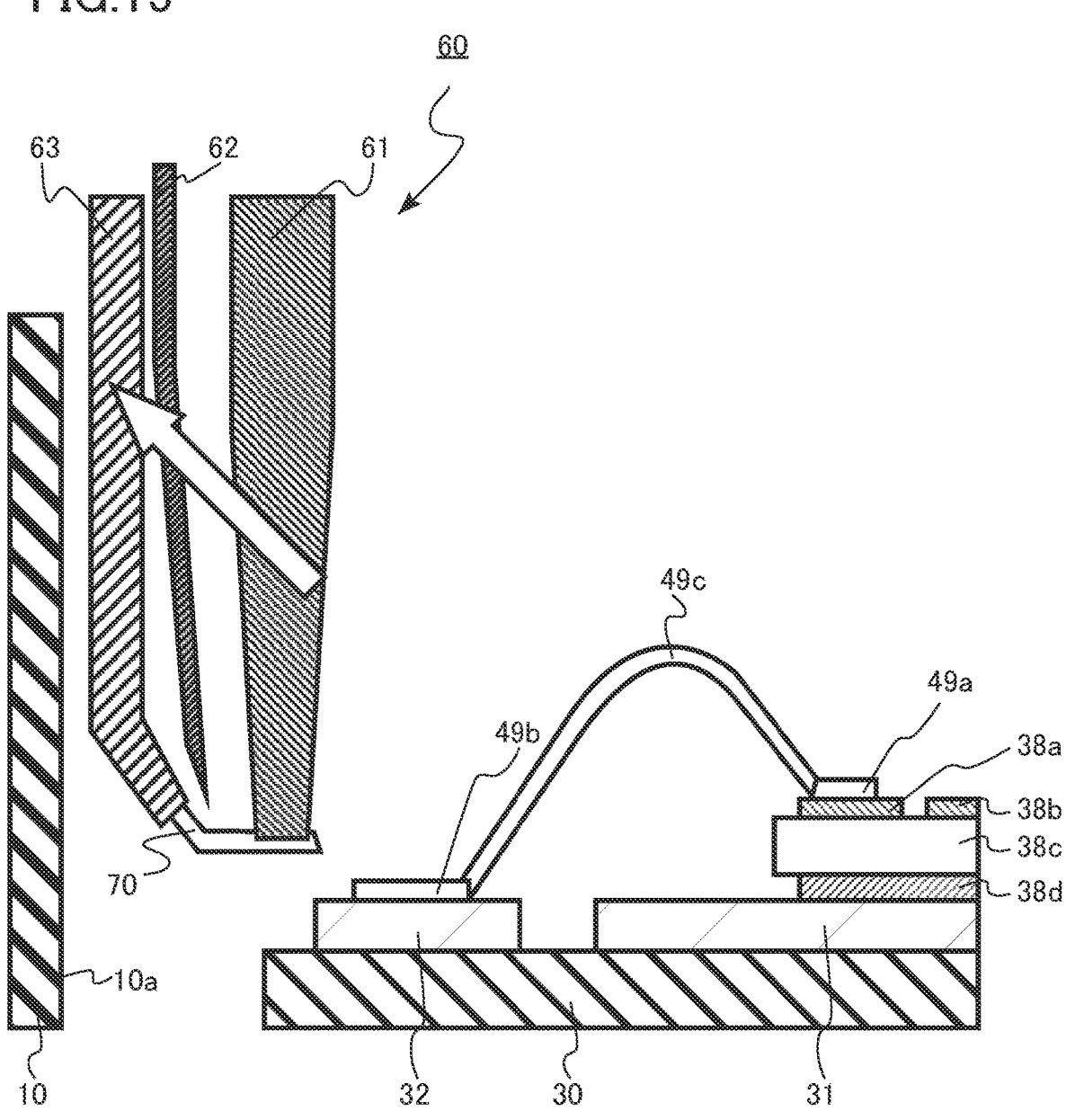
FIG. 15 is a schematic view illustrating the method for producing the semiconductor device according to the embodiment.

Next, in a state in which the wire 70 is clamped by the wire guide 63, the bonding head 60 is moved obliquely upward, and the wire 70 is pulled to be completely cut (FIG. 15). When the wire 70 is cut, the bonding head 60 is moved in the direction of the wall surface 10*a*. At this time, the bonding head 60 is moved in the second direction illustrated in FIG. 3.

The first bonding wire 41 is formed by the above method.

Next, functions and effects of the semiconductor device and the method for producing the semiconductor device according to the embodiment will be described.

Figure 16A:
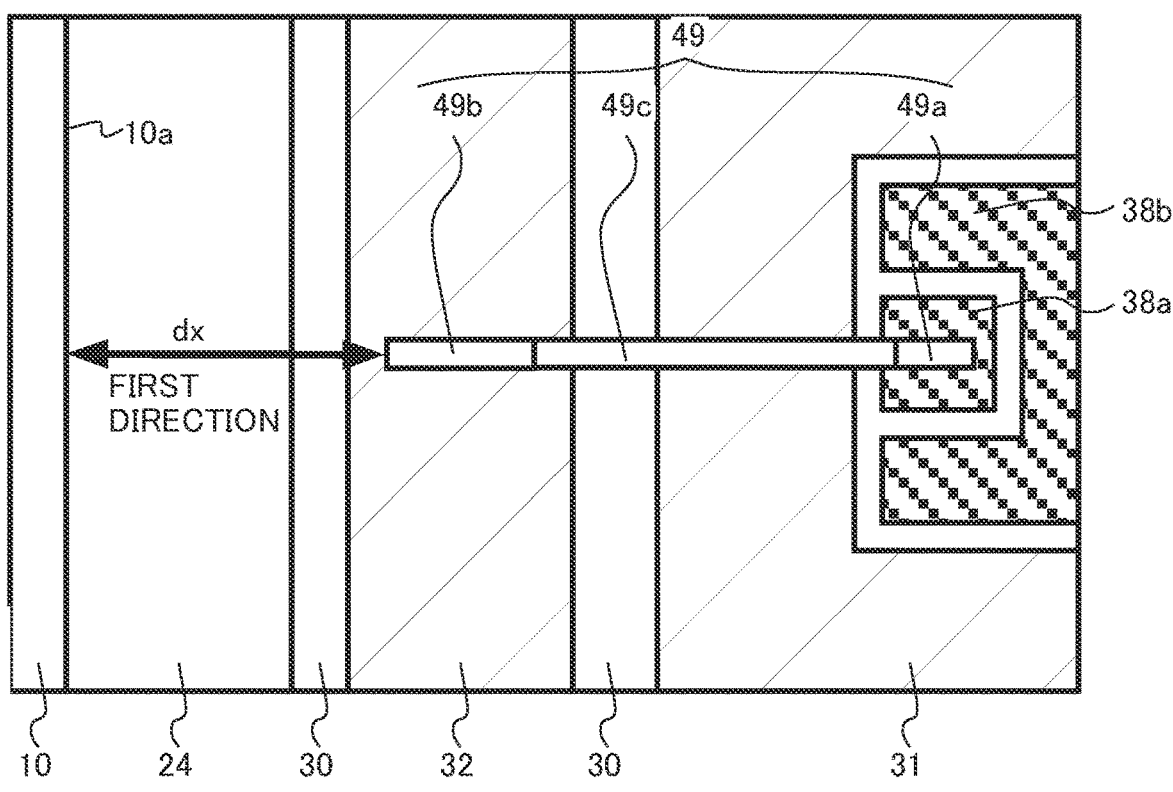
FIGS. 16A and 16B are explanatory views of functions and effects of the semiconductor device and the method for producing the semiconductor device according to the embodiment.
Figure 16B:
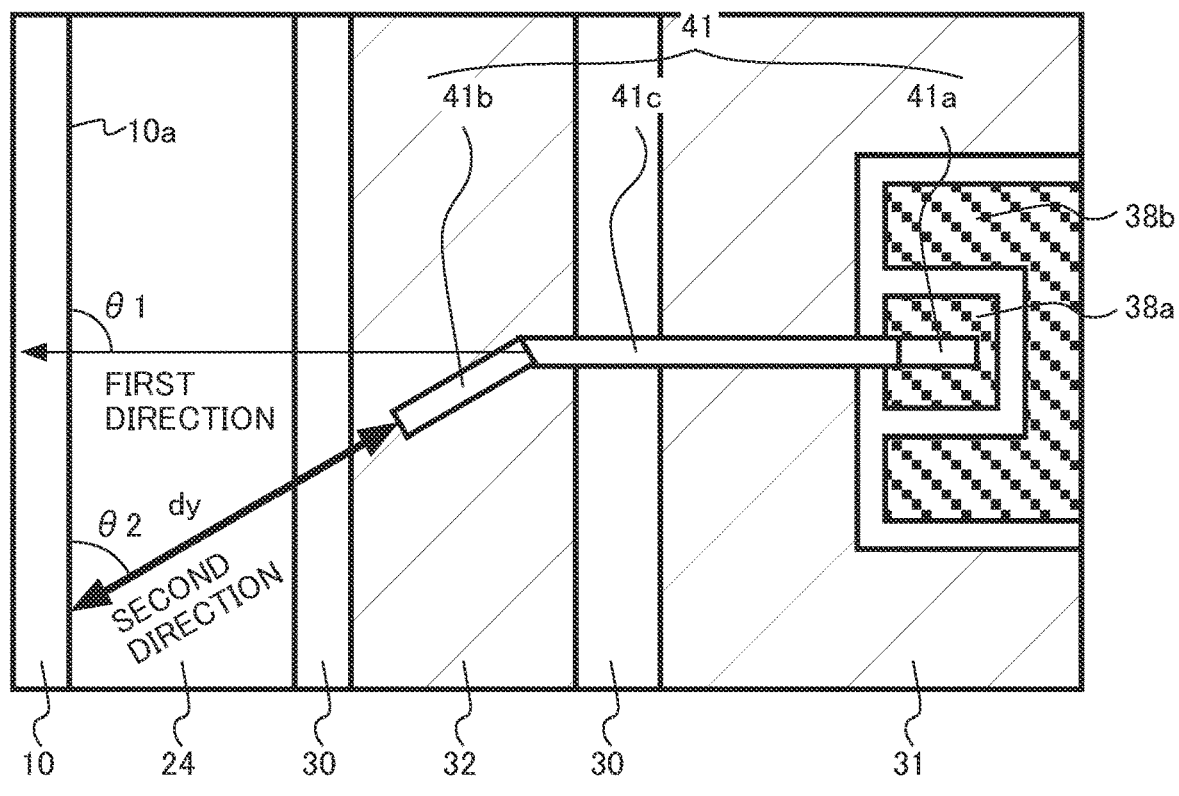

FIGS. 16A and 16B are explanatory views of functions and effects of the semiconductor device and the method for producing the semiconductor device according to the embodiment. FIG. 16A is an enlarged schematic top view of a semiconductor device of comparative example. FIG. 16B is an enlarged schematic top view of the semiconductor device according to the embodiment. FIGS. 16A and 16B are views corresponding to FIG. 3.

A bonding wire 49 of the semiconductor device of the comparative example includes a first bond portion 49*a*, a second bond portion 49*b*, and a loop portion 49*c*. The bonding wire 49 of the comparative example is different from the first bonding wire 41 of the embodiment in that the second bond portion 49*b* extends in the first direction similarly to the loop portion 49*c*.

In the bonding wire 49 of the comparative example, the distance dx in the first direction from the end of the second bond portion 49*b* to the wall surface 10*a* is smaller than the distance dy in the second direction from the end of the second bond portion 41*b* of the first bonding wire 41 to the wall surface 10*a* of the embodiment.

Figure 17:
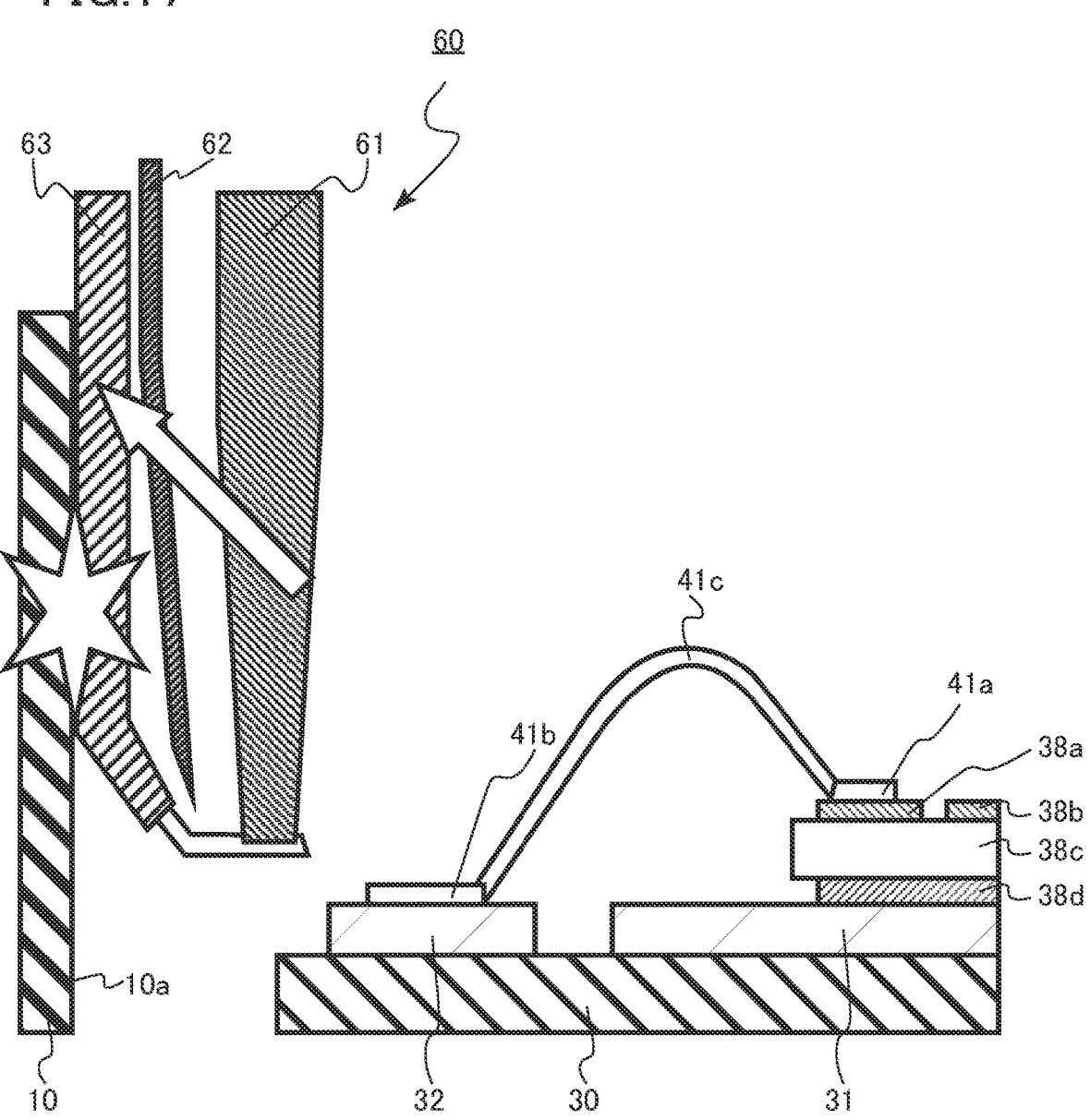
FIG. 17 is an explanatory view of a problem of a semiconductor device of comparative example.

FIG. 17 is an explanatory view of a problem of the semiconductor device of the comparative example. FIG. 17 is a view illustrating a method for forming the bonding wire 49 of the semiconductor device of the comparative example. FIG. 17 is a view corresponding to FIG. 15 of the method for producing the semiconductor device according to the embodiment. When the wire 70 is cut, the bonding head 60 is moved in the first direction toward the wall surface 10*a*. At this time, when the distance dx in the first direction from the end of the second bond portion 49*b* to the wall surface 10*a* is small, the bonding head 60 collides with the wall surface 10*a*. Therefore, it is difficult to continue the formation of the wire bonding.

In the embodiment, the second bond portion 41*b* extends in the second direction different from the first direction. The second angle θ2 formed between the second direction and the wall surface 10*a* of the resin case 10 is smaller than the first angle θ1 formed between the first direction and the wall surface 10*a* of the resin case 10.

Therefore, as illustrated in FIGS. 16A and 16B, the distance dy in the second direction from the end of the second bond portion 41*b* to the wall surface 10*a* when the wire 70 of the embodiment is cut is larger than the distance dx in the first direction from the end of the second bond portion 49*b* to the wall surface 10*a* of the comparative example. Therefore, in the embodiment, the collision of the bonding head 60 with the wall surface 10*a* is prevented.

In the embodiment, the collision of the bonding head 60 with the wall surface 10*a* is suppressed, so that the distance in the first direction from the second bond portion 41*b* of the first bonding wire 41 to the wall surface 10*a* can be made smaller than that of the comparative example. Therefore, miniaturization of the power semiconductor module 100 can be achieved.

From the viewpoint of reducing the distance in the first direction from the second bond portion 41*b* to the wall surface 10*a* to achieve the miniaturization of the power semiconductor module 100, the difference between the first angle θ1 and the second angle θ2 is preferably 10 degrees or more, more preferably 20 degrees or more, and still more preferably 30 degrees or more.

The electrode to which the first bond portion 41*a* of the first bonding wire 41 is connected is preferably the gate electrode pad 38*a* of a MOSFET or an IGBT as in the embodiment. A large current does not flow through the gate electrode pad 38*a* as compared with the source electrode 38*b* and the drain electrode 38*d*. Therefore, the size of the metal layer to which the second bond portion 41*b* is connected is reduced. For example, the width of the metal layer in the direction perpendicular to the wall surface 10*a* decreases. Therefore, the distance from the second bond portion 41*b* of the first bonding wire 41 to the wall surface 10*a* is likely to be shortened, and the semiconductor device and the method for producing the semiconductor device of the embodiment function effectively.

In the embodiment, the case where the MOSFET or the IGBT is used as the semiconductor chip has been described as an example, but the semiconductor chip is not limited thereto. For example, other transistors and diodes such as a Schottky barrier diode (SBD) and a PIN diode can be applied. A combination of a transistor and a diode can also be applied.

In the embodiment, the "two-in-one" module has been described as an example, but for example, a "four-in-one" module or a "six-in-one" module may be used.

In the embodiment, the case where the number of semiconductor chips is two has been described as an example, but the number of semiconductor chips may be one or three or more.

While certain embodiments have been described, these embodiments have been presented by way of example only, and are not intended to limit the scope of the inventions. Indeed, the semiconductor device and the method for producing the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a frame body having a wall surface;
an insulating substrate surrounded by the frame body, the insulating substrate having a first metal layer and a second metal layer on a surface, the second metal layer being located between the first metal layer and the wall surface;
a semiconductor chip including an electrode and provided on the first metal layer; and a bonding wire having a first wire connected to the electrode, a second wire connected to the second metal layer, and an intermediate wire between the first wire and the second wire, wherein, viewing from a direction perpendicular to the surface of the insulating substrate, a second angle formed between a second direction in which the second wire extends and the wall surface is smaller than a first angle formed between a first direction in which the intermediate wire extends and the wall surface.

2. The semiconductor device according to claim 1, wherein a difference between the first angle and the second angle is 10 degrees or more and 90 degrees or less.

3. The semiconductor device according to claim 1, wherein the semiconductor chip is a metal oxide semiconductor field effect transistor or an insulated gate bipolar transistor; and the electrode is a gate electrode pad.

4. The semiconductor device according to claim 1, wherein when the bonding wire is formed, the first wire is formed before the second wire.

5. A method for producing a semiconductor device, the method comprising:

preparing an insulating substrate surrounded by a frame body having a wall surface, the insulating substrate having a first metal layer and a second metal layer on a surface, the second metal layer being located between the first metal layer and the wall surface;

disposing a semiconductor chip including an electrode on the first metal layer;

forming a first wire of a bonding wire on the electrode;

forming an intermediate wire of the bonding wire, the intermediate wire extending in a first direction; and forming a second wire of the bonding wire on the second metal layer, the second wire extending in a second direction, wherein, viewing from a direction perpendicular to the surface of the insulating substrate, a second angle formed between the second direction and the wall surface is smaller than a first angle formed between the first direction and the wall surface.

6. The method for producing a semiconductor device according to claim 5, wherein the bonding wire is formed by a wedge bonding apparatus having a bonding head, the bonding head is moved in the first direction in the forming the intermediate wire, and the bonding head is moved in the second direction after the forming the second wire.

7. The method for producing a semiconductor device according to claim 5, wherein an angle formed between the first direction and the second direction is 10 degrees or more and 45 degrees or less.

8. The method for producing a semiconductor device according to claim 5, wherein an angle formed between the first direction and the second direction is 20 degrees or more and 45 degrees or less.

9. The method for producing a semiconductor device according to claim 6, wherein the bonding head is rotated in a plane horizontal to a surface of the second metal layer before the forming the second wire.

10. The method for producing a semiconductor device according to claim 5, wherein the semiconductor chip is a metal oxide semiconductor field effect transistor or an insulated gate bipolar transistor; and the electrode is a gate electrode pad.

11. The semiconductor device according to claim 1, wherein a difference between the first angle and the second angle is 20 degrees or more and 45 degrees or less.

12. The semiconductor device according to claim 1, wherein the second angle is 60 degrees or more and 80 degrees or less.

13. A semiconductor device comprising:

a frame body having a wall surface;

an insulating substrate surrounded by the frame body, the insulating substrate having a first metal layer and a second metal layer on a surface, the second metal layer being located between the first metal layer and the wall surface;

a semiconductor chip including an electrode and provided on the first metal layer; and a bonding wire having a first wire connected to the electrode, a second wire connected to the second metal layer, and an intermediate wire between the first wire and the second wire, the second wire including a first end and a second end, the first end being connected to the intermediate wire, the second end being opposite to the first end, both the first and second ends being in contact with the second metal layer, wherein, a distance between the first and second ends along a first direction that extends from the first end to the second end is greater than a distance between the first and second ends along a second direction perpendicular to the wall surface.

14. The semiconductor device according to claim 13, wherein viewing from a direction perpendicular to the surface of the insulating substrate, a first angle formed between the first direction and the wall surface is smaller than a second angle formed between a third direction in which the intermediate wire extends and the wall surface, and a difference between the first angle and the second angle is 10 degrees or more and 90 degrees or less.

15. The semiconductor device according to claim 14, wherein a difference between the first angle and the second angle is 20 degrees or more and 45 degrees or less.

16. The semiconductor device according to claim 13, wherein the semiconductor chip is a metal oxide semiconductor field effect transistor or an insulated gate bipolar transistor; and the electrode is a gate electrode pad.

17. The semiconductor device according to claim 13, wherein when the bonding wire is formed, the first wire is formed before the second wire.

18. The semiconductor device according to claim 13, wherein the second angle is 60 degrees or more and 80 degrees or less.

* * * * *